(12) United States Patent
Shin et al.

(10) Patent No.: US 12,334,174 B2
(45) Date of Patent: Jun. 17, 2025

(54) ELECTRONIC DEVICES RELATED TO COMPENSATION OF MONITORING SIGNALS

(71) Applicant: SK hynix Inc., Icheon-si (KR)

(72) Inventors: Yoon Jae Shin, Icheon-si (KR); Doo Hyun Son, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 205 days.

(21) Appl. No.: 18/330,117

(22) Filed: Jun. 6, 2023

(65) Prior Publication Data

US 2024/0304272 A1  Sep. 12, 2024

(30) Foreign Application Priority Data

Mar. 9, 2023 (KR) .......................... 10-2023-0031305

(51) Int. Cl.
*G11C 29/46* (2006.01)
*G11C 7/02* (2006.01)
*G11C 29/12* (2006.01)

(52) U.S. Cl.
CPC .............. *G11C 29/46* (2013.01); *G11C 7/02* (2013.01); *G11C 29/12005* (2013.01)

(58) Field of Classification Search
CPC ................................ G11C 29/46; G11C 7/02
USPC ............................................................ 365/201
See application file for complete search history.

(56) References Cited

U.S. PATENT DOCUMENTS

| 2008/0062741 | A1* | 3/2008 | Choi .................. G11C 13/0004 365/201 |
| 2008/0062746 | A1* | 3/2008 | Loh ........................ G11C 29/50 365/201 |
| 2013/0134954 | A1  | 5/2013 | Yano et al. |
| 2015/0204941 | A1* | 7/2015 | Schneider ................ G11C 7/04 702/117 |
| 2020/0233770 | A1* | 7/2020 | You .................. G11C 29/50004 |
| 2022/0185208 | A1* | 6/2022 | Sato .................... H02M 1/0022 |

FOREIGN PATENT DOCUMENTS

KR   1020110099646 A   9/2011

* cited by examiner

*Primary Examiner* — Muna A Techane
(74) *Attorney, Agent, or Firm* — WILLIAM PARK & ASSOCIATES LTD.

(57) ABSTRACT

An electronic device includes a monitoring signal generation circuit configured to receive an internal voltage to generate a monitoring signal, based on a voltage selection signal in a test mode, and an internal voltage drive circuit configured to receive the internal voltage and monitoring signal from the monitoring signal generation circuit and drive the internal voltage to compensate for the monitoring signal when the monitoring signal is distorted according to a leakage current in the test mode.

20 Claims, 12 Drawing Sheets

ELECTRONIC DEVICES RELATED TO COMPENSATION OF MONITORING SIGNALS

CROSS-REFERENCE TO RELATED APPLICATIONS

The present application claims priority under 35 U.S.C. 119(a) to Korean Patent Application No. 10-2023-0031305, filed on Mar. 9, 2023, in the Korean Intellectual Property Office, which is incorporated herein by reference in its entirety.

BACKGROUND

1. Technical Field

Embodiments of the present disclosure generally relate to electronic devices, and more particularly, to electronic devices related to compensation of a monitoring signal.

2. Related Art

In general, an electronic device includes internal voltage generation circuits to generate various internal voltages required for internal operations, and includes a circuit for monitoring voltage levels of the internal voltages generated therein to ensure reliability of internal operations.

Meanwhile, the reliability of the internal operations of MOS transistors used in the electronic devices may be impaired by gate induced drain leakage (GIDL). The GIDL refers to a phenomenon in which leakage current is generated when electrons are tunneled toward a drain by an electric field when a large negative voltage is applied to a gate of a MOS transistor.

SUMMARY

The present disclosure may provide an electronic device including a monitoring signal generation circuit configured to receive an internal voltage generate a monitoring signal, based on a voltage selection signal in a test mode, and an internal voltage drive circuit configured to receive the internal voltage and monitoring signal from the monitoring signal generation circuit and drive the internal voltage to compensate for the monitoring signal when the monitoring signal is distorted according to a leakage current in the test mode.

In addition, the present disclosure may provide an electronic device including an internal voltage drive circuit configured to receive an internal voltage to drive the internal voltage to compensate for a monitoring signal when the monitoring signal is distorted according to a leakage current in a test mode in which the monitoring signal is generated from the internal voltage, and a compensation monitoring signal generation circuit configured to generate a compensation monitoring signal including information on whether the monitoring signal distorted according to the leakage current in the test mode has been compensated for by the internal voltage drive circuit.

DETAILED DESCRIPTION

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes 2 bits, when the logic level of each of the 2 bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

Figure 1:
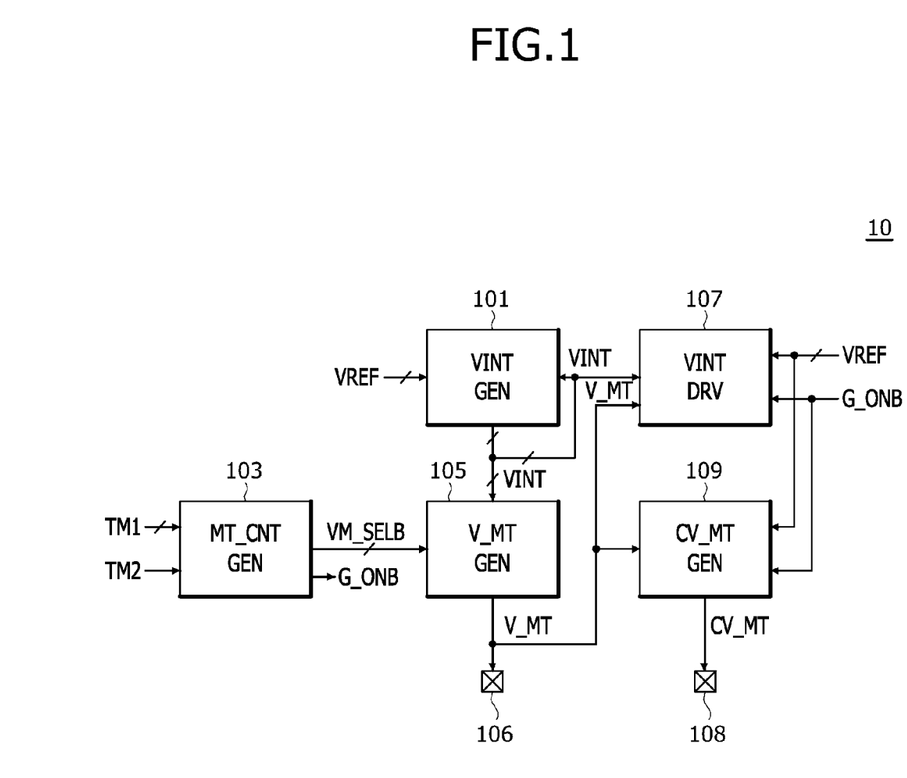
FIG. 1 is a block diagram illustrating a configuration of an electronic device according to an embodiment of the present disclosure.

FIG. 1 is a block diagram illustrating a configuration of an electronic device 10 according to an embodiment of the present disclosure. As shown in FIG. 1, the electronic device 10 may include an internal voltage generation circuit (VINT GEN) 101, a monitoring control signal generation circuit (MT_CNT GEN) 103, a monitoring signal generation circuit (V_MT GEN) 105, an internal voltage drive circuit (VINT DRV) 107, a compensation monitoring signal generation circuit (CV_MT GEN) 109, and pads 106 and 108.

The internal voltage generation circuit 101 may generate an internal voltage VINT based on a reference voltage VREF. For example, the internal voltage generation circuit 101 may drive the internal voltage VINT when the input internal voltage VINT has a voltage level less than the reference voltage VREF, and may stop driving of the internal voltage VINT when the input internal voltage VINT has a voltage level equal to or higher than the reference voltage VREF. The reference voltage VREF may include first to $L^{th}$ reference voltages (VREF<1:L> in FIG. 2), and the internal voltage VINT may include first to $L^{th}$ internal voltages (VINT<1:L> in FIG. 2). The internal voltage generation circuit 101 may drive the first to $L^{th}$ internal voltages VINT<1:L> based on the first to $L^{th}$ reference voltages VREF<1:L> and the first to $L^{th}$ internal voltages VINT<1:L>.

The monitoring control signal generation circuit 103 may generate a voltage selection signal VM_SELB and a compensation control signal G_ONB based on a first test mode signal TM1 and a second test mode signal TM2. The first test mode signal TM1 and the second test mode signal TM2 may be generated for operations in a test mode in which a monitoring signal V_MT distorted according to a leakage current is compensated for. The first test mode signal TM1 and the second test mode signal TM2 may be generated depending on whether fuses (not shown) are cut or may be generated through a mode register set operation. The monitoring control signal generation circuit 103 may generate the voltage selection signal VM_SELB based on the first test mode signal TM1. The first test mode signal TM1 may include a plurality of bits. More specifically, the monitoring control signal generation circuit 103 may generate the voltage selection signal VM_SELB based on a logic bit set of the bits included in the first test mode signal TM1. For example, the monitoring control signal generation circuit 103 may generate an activated first voltage selection signal (VM_SELB<1> in FIG. 5) when the bits included in the first test mode signal TM1 are set to have a first logic bit set, and may generate an activated second voltage selection signal (VM_SELB<2> in FIG. 5) when the bits included in the first test mode signal TM1 are set to have a second logic bit set. The monitoring control signal generation circuit 103 may generate the compensation control signal G_ONB based on the second test mode signal TM2. The compensation control signal G_ONB may be activated for the operation in the test mode for compensating for the monitoring signal V_MT distorted according to the leakage current when the second test mode signal TM2 is set to have a predetermined logic level.

The monitoring signal generation circuit 105 may receive the internal voltage VINT from the internal voltage generation circuit 101, and may receive the voltage selection signal VM_SELB from the monitoring control signal generation circuit 103. The monitoring signal generation circuit 105 may generate the monitoring signal V_MT from the internal voltage VINT based on the voltage selection signal VM_SELB. When the internal voltage VINT includes the first to $L^{th}$ internal voltages (VINT<1:L> in FIG. 5), the monitoring signal generation circuit 105 may select one of the first to $L^{th}$ internal voltages VINT<1:L> as the monitoring signal V_MT according to the voltage selection signal VM_SELB to output the monitoring signal V_MT through the pad 106.

The internal voltage drive circuit 107 may receive the internal voltage VINT from the internal voltage generation circuit 101, may receive the compensation control signal G_ONB from the monitoring control signal generation circuit 103, and may receive the monitoring signal V_MT from the monitoring signal generation circuit 105. The internal voltage drive circuit 107 may pull-down drive the internal voltage VINT based on the compensation control signal G_ONB, the monitoring signal V_MT, and the reference voltage VREF. More specifically, the internal voltage drive circuit 107 may pull-down drive the internal voltage VINT to lower the voltage level of the internal voltage VINT based on a comparison result of the monitoring signal V_MT and the reference voltage VREF when the compensation control signal G_ONB is activated. Because the internal voltage VINT has a voltage level that is lowered due to pull-down driving is transferred as the monitoring signal V_MT, the voltage level of the monitoring signal V_MT increased due to the leakage current according to the GIDL can be compensated for by the pull-down driven internal voltage VINT.

The compensation monitoring signal generation circuit 109 may receive the compensation control signal G_ONB from the monitoring control signal generation circuit 103, and may receive the monitoring signal V_MT from the monitoring signal generation circuit 105. The compensation monitoring signal generation circuit 109 may generate a compensation monitoring signal CV_MT including information on whether the monitoring signal V_MT distorted according to the leakage current has been compensated for, based on the compensation control signal G_ONB, the monitoring signal V_MT, and the reference voltage VREF. More specifically, the compensation monitoring signal generation circuit 109 may generate the compensation monitoring signal CV_MT having a logic level that is set according to a comparison result between the monitoring signal V_MT and the reference voltage VREF when the compensation control signal G_ONB is activated. Depending on the logic level of the compensation monitoring signal CV_MT, it can be confirmed whether the monitoring signal V_MT distorted according to the leakage current has been compensated for by the internal voltage drive circuit 107. The compensation monitoring signal generation circuit 109 may output the compensation monitoring signal CV_MT through the pad 108.

Figure 2:
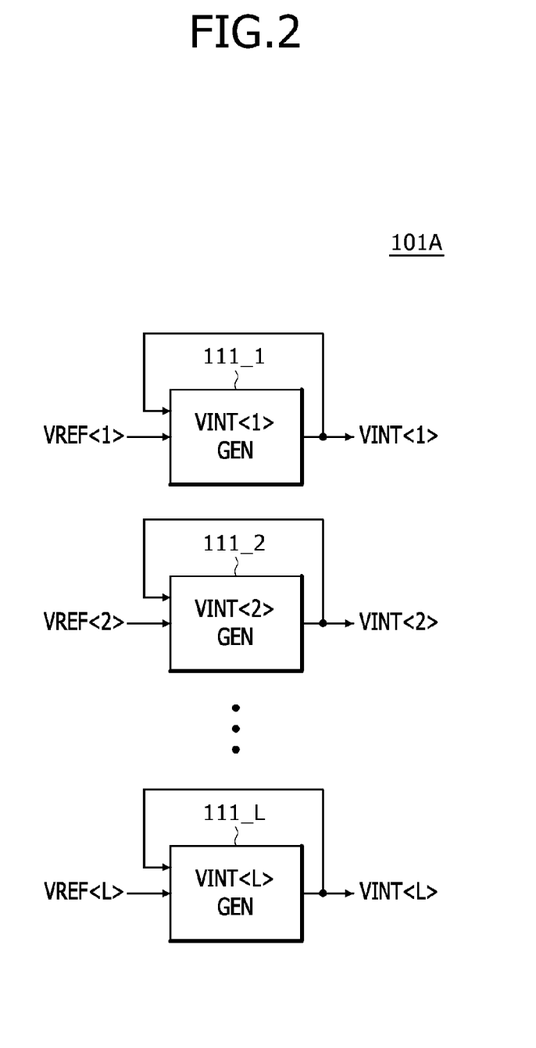
FIG. 2 is a block diagram illustrating a configuration according to an embodiment of an internal voltage generation circuit included in the electronic device of FIG. 1.

FIG. 2 is a block diagram illustrating a configuration of an internal voltage generation circuit 101A according to an embodiment of the internal voltage generation circuit 101 of FIG. 1. As shown in FIG. 2, the internal voltage generation circuit 101A may include first to $L^{th}$ internal voltage generation circuits (VINT<1> GEN~VINT<L> GEN) 111_1~111_L. As used herein, the tilde "~" indicates a range of components. For example, "VINT<1> GEN~VINT<L> GEN" indicates the internal voltage generation circuits VINT<1> GEN, VINT<2> GEN, . . . , and VINT<L> GEN shown in FIG. 2.

The first internal voltage generation circuit (VINT<1> GEN) 111_1 may generate the first internal voltage VINT<1> based on the first reference voltage VREF<1> and the first internal voltage VINT<1>. More specifically, the first internal voltage generation circuit 111_1 may drive the first internal voltage VINT<1> when the first internal voltage VINT<1> has a voltage level lower than the first reference voltage VREF<1>, and may stop driving the first internal voltage VINT<1> when the first internal voltage VINT<1> has a voltage level equal to or higher than the first reference voltage VTEF<1>. The first reference voltage VREF<1> may be generated inside the electronic device (10 in FIG. 1) to set the voltage level of the first internal voltage VINT<1>.

The second internal voltage generation circuit (VINT<2> GEN) 111_2 may generate the second internal voltage VINT<2> based on the second reference voltage VREF<2> and the first internal voltage VINT<1>. More specifically, the second internal voltage generation circuit 111_2 may drive the second internal voltage VINT<2> when the second internal voltage VINT<2> has a voltage level lower than the second reference voltage VTEF<2>, and may stop driving of the second internal voltage VINT<2> when the second internal voltage VINT<2> has a voltage level equal to or higher than the second reference voltage VREF<2>. The second reference voltage VREF<2> may be generated inside the electronic device (10 in FIG. 1) to set the voltage level of the second internal voltage VINT<2>.

The $L^{th}$ internal voltage generation circuit (VINT<L> GEN) 111_L may generate the $L^{th}$ internal voltage VINT<L> based on the $L^{th}$ reference voltage VREF<L> and the $L^{th}$ internal voltage VINT<L>. More specifically, the $L^{th}$ internal voltage generation circuit 111_L may drive the $L^{th}$ internal voltage VINT<L> when the $L^{th}$ internal voltage VINT<L> has a voltage level lower than the $L^{th}$ reference voltage VREF<L>, and may stop driving of the $L^{th}$ internal voltage VINT<L> when the $L^{th}$ internal voltage VINT<L> has a voltage level equal to or higher than the $L^{th}$ reference voltage VTEF<L>. The $L^{th}$ reference voltage VREF<L> may be generated inside the electronic device (10 in FIG. 1) to set the voltage level of the $L^{th}$ internal voltage VINT<L>.

Figure 3:
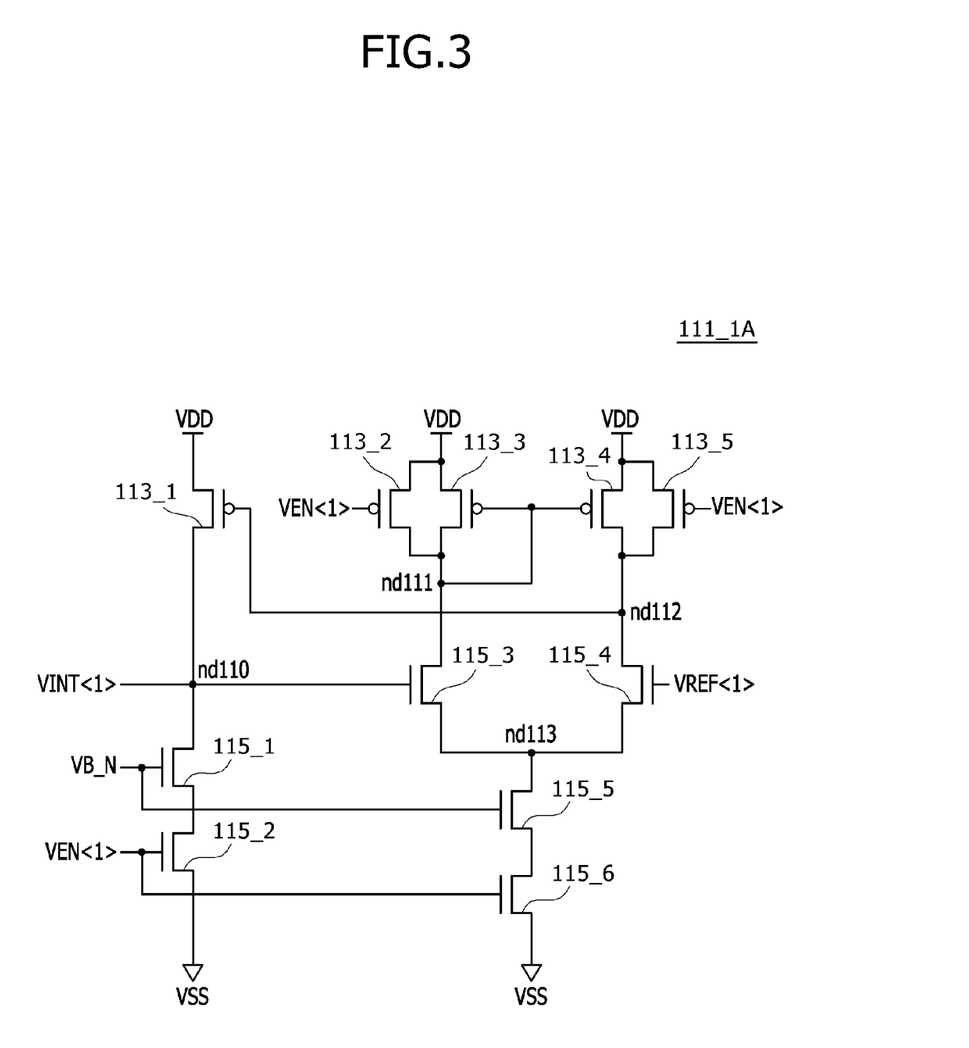
FIG. 3 is a block diagram illustrating a configuration according to an embodiment of a first internal voltage generation circuit included in the internal voltage generation circuit of FIG. 2.

FIG. 3 is a block diagram illustrating a configuration of a first internal voltage generation circuit 111_1A according to an embodiment of the first internal voltage generation circuit 111_1 of FIG. 2. As shown in FIG. 3, the first internal voltage generation circuit 111_1A may include PMOS transistors 113_1~113_5 and NMOS transistors 115_1~115_6. The PMOS transistor 113_1 may be connected between a power supply voltage VDD terminal and a node nd110 and may be turned on in response to a voltage of a node nd112. The PMOS transistor 113_2 may be connected between the power supply voltage VDD terminal and a node nd111 and may be turned on in response to a first voltage activation signal VEN<1>. The first voltage activation signal VEN<1> may be activated when the activated first voltage selection signal VM_SELB<1> is generated to generate the first internal voltage VINT<1> in a state where the compensation control signal G_ONB is activated for the operation in the test mode. The PMOS transistor 113_3 may be connected between the power supply voltage VDD terminal and the node nd111 and may be turned on in response to a voltage of the node nd111. The PMOS transistor 113_4 may be connected between the power supply voltage VDD terminal and the node nd112 and may be turned on in response to the voltage of the node nd111. The PMOS transistor 113_5 may be connected between the power supply voltage VDD terminal and the node nd112 and may be turned on in response to the first voltage activation signal VEN<1>. The NMOS transistor 115_1 and the NMOS transistor 115_2 may be connected in series between a node nd110 and a ground voltage VSS terminal. The NMOS transistor 115_1 may be turned on in response to a bias voltage VB_N. The bias voltage VB_N may be generated at a preset voltage level so that the NMOS transistor 115_1 is turned on when the first internal voltage VINT<1> is generated. The NMOS transistor 115_2 may be turned on in response to the first voltage activation signal VEN<1>. The NMOS transistor 115_3 may be connected between the node nd111 and a node nd113 and may be turned on in response to the first internal voltage VINT<1>. The NMOS transistor 115_4 may be connected between the node nd112 and the node nd113 and may be turned on in response to the first reference voltage VREF<1>. The NMOS transistor 115_5 and the NMOS transistor 115_6 may be connected in series between the node nd113 and the ground voltage VSS terminal. The NMOS transistor 115_5 may be turned on in response to the bias voltage VB_N. The NMOS transistor 115_6 may be turned on in response to the first voltage activation signal VEN<1>. The first internal voltage generation circuit 111_1A may drive the internal voltage VINT based on a comparison result of the reference voltage VREF and the internal voltage VINT when the first voltage activation signal VEN<1> is activated to generate the first internal voltage VINT<1> in the operation in the test mode. More specifically, the first internal voltage generation circuit 111_1A may drive the first internal voltage VINT<1> to the power supply voltage VDD when the first internal voltage VINT<1> has a voltage level lower than the first reference voltage VREF<1>, and may stop driving of the first internal voltage VINT<1> when the first internal voltage VINT<1> has a voltage level equal to or higher than the first reference voltage VREF<1>, in a state in which the first voltage activation signal VEN<1> is activated.

Figure 4:
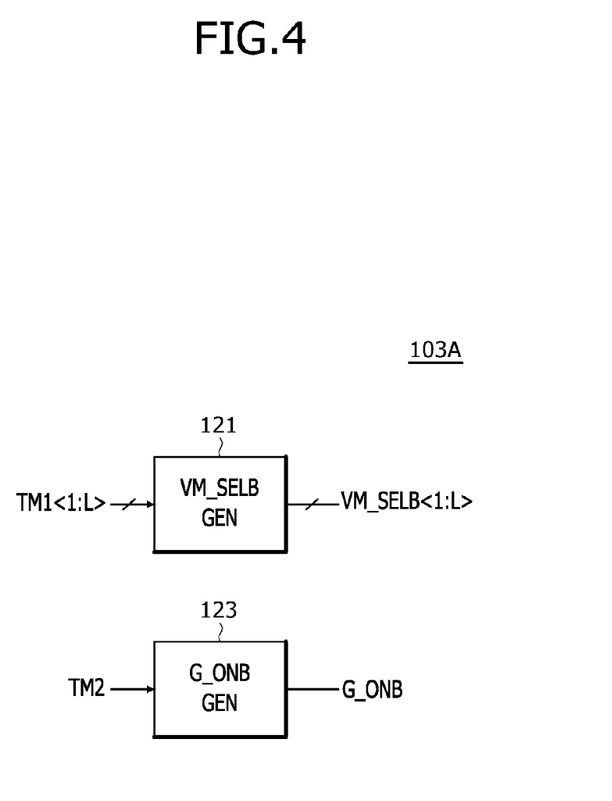
FIG. 4 is a block diagram illustrating a configuration according to an embodiment of a monitoring control signal generation circuit included in the electronic device of FIG. 1.

FIG. 4 is a block diagram illustrating a configuration of a monitoring control signal generation circuit 103A according to an embodiment of the monitoring control signal generation circuit 103 of FIG. 1. As shown in FIG. 4, the monitoring control signal generation circuit 103A may include a voltage selection signal generation circuit (VM_SELB GEN) 121 and a compensation control signal generation circuit (G_ONB GEN) 123.

The voltage selection signal generation circuit 121 may generate the voltage selection signal VM_SELB based on the first test mode signal TM1. More specifically, the voltage selection signal generation circuit 121 may generate the voltage selection signal VM_SELB based on a logic bit set of bits included in the first test mode signal TM1. For example, the voltage selection signal generation circuit 121 may generate an activated first voltage selection signal VM_SELB<1> when the bits included in the first test mode signal TM1 are set to have a first logic bit set, and may generate an activated $L^{th}$ voltage selection signal VM_SELB<L> when the bits included in the first test mode signal TM1 are set to have a $L^{th}$ logic bit set.

The compensation control signal generation circuit 123 may generate the compensation control signal G_ONB based on the second test mode signal TM2. The compensation control signal generation circuit 123 may generate the compensation control signal G_ONB that is activated for the operation in the test mode in which the monitoring signal V_MT distorted according to the leakage current is compensated for when the second test mode signal TM2 is set to have a preset logic level.

Figure 5:
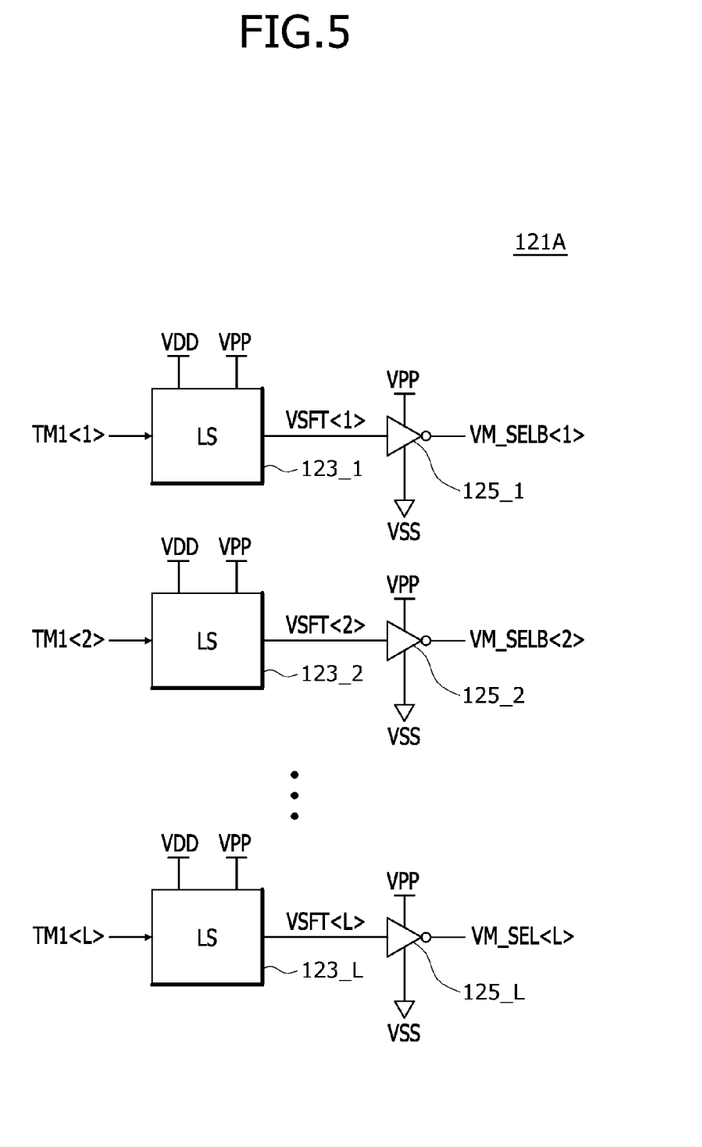
FIG. 5 is a diagram illustrating a configuration according to an embodiment of a voltage selection signal generation circuit included in the monitoring control signal generation circuit of FIG. 4.

FIG. 5 is a diagram illustrating a configuration of a voltage selection signal generation circuit 121A according to an embodiment of the voltage selection signal generation circuit 121 of FIG. 4. As shown in FIG. 5, the voltage selection signal generation circuit 121A may include first to $L^{th}$ level shifters (LS) 123_1~123_L and inverters 125_1~125_L. Each of the first to $L^{th}$ level shifters 123_1~123_L may receive the power supply voltage VDD and a high voltage VPP to perform level shifting for the first test mode signal TM1. The first level shifter 123_1 may level-shift a first bit TM1<1> of the first test mode signal TM1 that swings between the power supply voltage VDD and the ground voltage VSS to generate a first shifting signal VSFT<1> that swings between the high voltage VPP and the ground voltage VSS. The second level shifter 123_2 may level-shift a second bit TM1<2> of the first test mode signal TM1 that swings between the power supply voltage VDD and the ground voltage VSS to generate a second shifting signal VSFT<2> that swings between the high voltage VPP and the ground voltage VSS. The $L^{th}$ level shifter 123_L may level-shift a $L^{th}$ bit TM1<L> of the first test mode signal TM1 that swings between the power supply voltage VDD and the ground voltage VSS to generate a $L^{th}$ shifting signal VSFT<L> that swings between the high voltage VPP and the ground voltage VSS. The inverter 125_1 may inversely buffer the first shifting signal VSFT<1> to generate the first voltage selection signal VM_SELB<1>. The inverter 125_2 may inversely buffer the second shifting signal VSFT<2> to generate the second voltage selection signal VM_SELB<2>. The inverter 125_L may inversely buffer the $L^{th}$ shifting signal VSFT<L> to generate the $L^{th}$ voltage selection signal VM_SELB<L>.

The voltage selection signal generation circuit 121A may generate the first shifting signal VSFT<1> driven to the high voltage VPP and generate the first voltage selection signal VM_SELB<1> activated at a logic "low" level when the first test mode signal TM1 is at a first logic bit set. The case where the first test mode signal TM1 is at the first logic bit set may be defined as a case where the first bit TM1<1> of the first test mode signal TM1 is at a logic "high" level and the second to $L^{th}$ bits TM1<2:L> of the first test mode signal TM1 are at logic "low" levels. The voltage selection signal generation circuit 121A may generate the second shifting signal VSFT<2> driven to the high voltage VPP and generate the second voltage selection signal VM_SELB<2> activated at a logic "low" level when the first test mode signal TM1 is at a second logic bit set. The case where the first test mode signal TM1 is at the second logic bit set may be defined as a case where the first bit TM1<1> of the first test mode signal TM1 is at a logic "low" level, the second bit TM1<2> of the first test mode signal TM1 is at a logic "high" level, and the third to $L^{th}$ bits TM1<3:L> of the first test mode signal TM1 are at logic "low" levels. The voltage selection signal generation circuit 121A may generate the $L^{th}$ shifting signal VSFT<L> driven to the high voltage VPP and generate the $L^{th}$ voltage selection signal VM_SELB<L> activated at a logic "low" level when the first test mode signal TM1 is at a $L^{th}$ logic bit set. The case where the first test mode signal TM1 is at the $L^{th}$ logic bit set may be defined as a case where the first to (L−1)$^{th}$ bits TM1<1:L−1> of the first test mode signal TM1 are at logic "low" levels, and the $L^{th}$ bit TM1<L> of the first test mode signal TM1 is at a logic "high" level.

Figure 6:
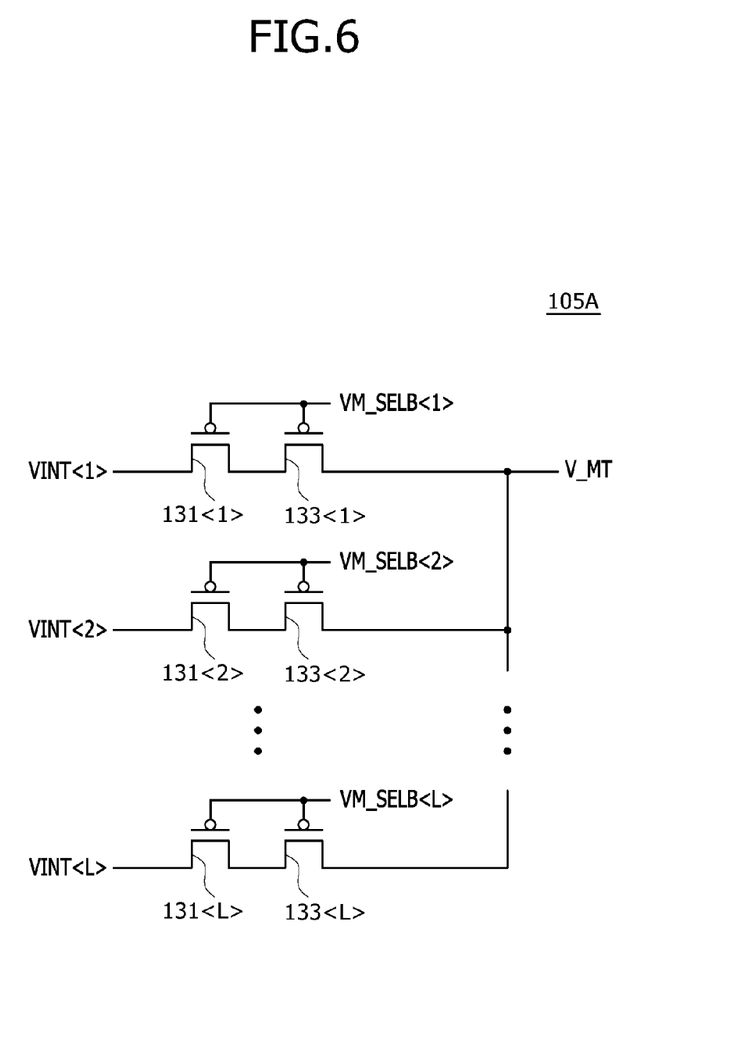
FIG. 6 is a circuit diagram according to an embodiment of the monitoring signal generation circuit included in the electronic device of FIG. 1.

FIG. 6 is a circuit diagram of a monitoring signal generation circuit 105A according to an embodiment of the monitoring signal generation circuit 105 of FIG. 1. As shown in FIG. 6, the monitoring signal generation circuit 105A may include PMOS transistors 131<1:L> and 133<1:L>. The PMOS transistors 131<1> and 133<1> may be turned on in response to the first voltage selection signal VM_SELB<1> to output the first internal voltage VINT<1> as the monitoring signal V_MT. The PMOS transistors 131<2> and 133<2> may be turned on in response to the second voltage selection signal VM_SELB<2> to output the second internal voltage VINT<1> as the monitoring signal V_MT. The PMOS transistors 131<L> and 133<L> may be turned on in response to the $L^{th}$ voltage selection signal VM_SELB<L> to output the $L^{th}$ internal voltage VINT<L> as the monitoring signal V_MT. The monitoring signal generation circuit 105A may output the first internal voltage VINT<1> as the monitoring signal V_MT when the first voltage selection signal VM_SELB<1> is activated at a logic "low" level by the first test mode signal TM1 set to have the first logic bit set. The monitoring signal generation circuit 105A may output the second internal voltage VINT<2> as the monitoring signal V_MT when the second voltage selection signal VM_SELB<2> is activated at a logic "low" level by the first test mode signal TM1 set to have the second logic bit set. The monitoring signal generation circuit 105A may output the $L^{th}$ internal voltage VINT<L> as the monitoring signal V_MT when the $L^{th}$ voltage selection signal VM_SELB<L> is activated at a logic "low" level by the first test mode signal TM1 set to have the $L^{th}$ logic bit set.

Figure 7:
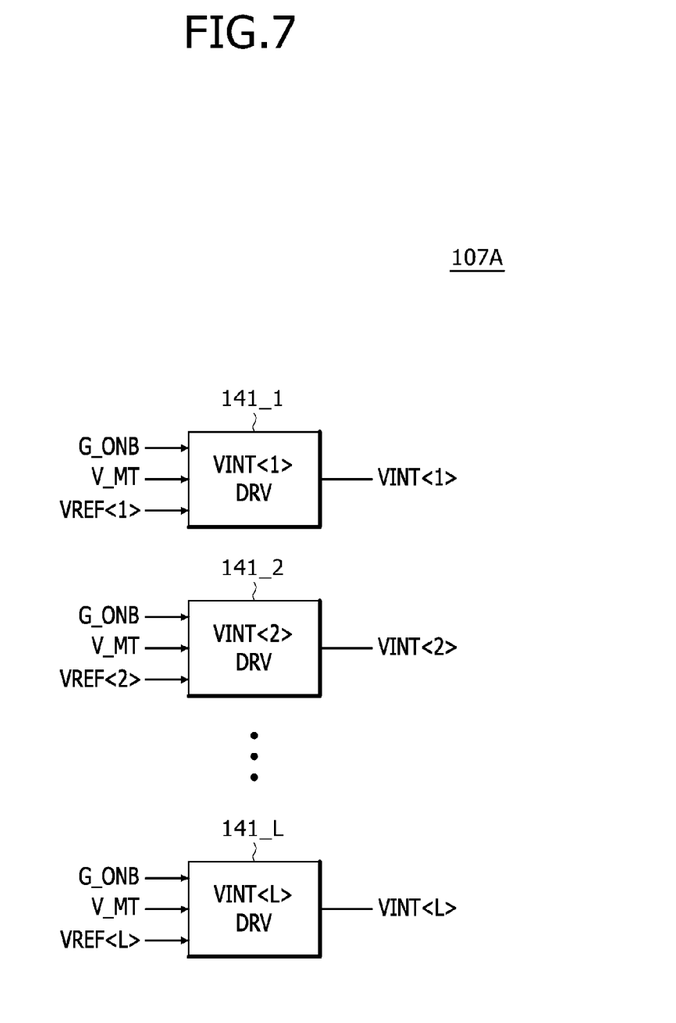
FIG. 7 is a diagram illustrating a configuration according to an embodiment of an internal voltage drive circuit included in the electronic device of FIG. 1.

FIG. 7 is a diagram illustrating a configuration of an internal voltage drive circuit 107A according to an embodiment of the internal voltage drive circuit 107 of FIG. 1. As shown in FIG. 7, the internal voltage drive circuit 107A may include first to $L^{th}$ internal voltage drive circuits (VINT<1:L> DRV) 141_1~141_L.

The first internal voltage drive circuit 141_1 may pull-down drive the first internal voltage VINT<1> based on the compensation control signal G_ONB, the monitoring signal V_MT, and the first reference voltage VREF<1>. More specifically, the first internal voltage drive circuit 141_1 may pull-down drive the first internal voltage VINT<1> based on a comparison result of the monitoring signal V_MT and the first reference voltage VREF<1> when the compensation control signal G_ONB is activated. As an example, the first internal voltage drive circuit 141_1 may pull-down drive the first internal voltage VINT<1> to lower the voltage level of the first internal voltage VINT<1> when the monitoring signal V_MT has a voltage level higher than the first reference voltage VREF<1> in a state where the compensation control signal G_ONB is activated for the operations in the test mode. As another example, the first internal voltage drive circuit 141_1 may stop the operation of pull-down driving the first internal voltage VINT<1> when the monitoring signal V_MT has a voltage level equal to or lower than the first reference voltage VREF<1> in a state where the compensation control signal G_ONB is activated.

The first internal voltage VINT<1> having a voltage level that is lowered due to pull-down driving may be transferred as the monitoring signal V_MT through the turned-on PMOS transistors (131<1> and 133<1> in FIG. 6). Accordingly, the voltage level of the monitoring signal V_MT having a voltage level that is increased due to the leakage current according to the GIDL may be compensated by the pull-down driven first internal voltage VINT<1>.

The second internal voltage drive circuit 141_2 may pull-down drive the second internal voltage VINT<2> based on the compensation control signal G_ONB, the monitoring signal V_MT, and the second reference voltage VREF<2>. More specifically, the second internal voltage drive circuit 141_2 may pull-down drive the second internal voltage VINT<2> based on a comparison result of the monitoring signal V_MT and the second reference voltage VREF<2> when the compensation control signal G_ONB is activated. As an example, the second internal voltage drive circuit 141_2 may pull-down drive the second internal voltage VINT<2> to lower the voltage level of the second internal voltage VINT<2> when the monitoring signal V_MT has a voltage level higher than the second reference voltage VREF<2> in a state where the compensation control signal G_ONB is activated for the operations in the test mode. As another example, the second internal voltage drive circuit 141_2 may stop the operation of pull-down driving the second internal voltage VINT<2> when the monitoring signal V_MT has a voltage level equal to or lower than the second reference voltage VREF<2> in a state where the compensation control signal G_ONB is activated. The second internal voltage VINT<2> having a voltage level that is lowered due to pull-down driving may be transferred as the monitoring signal V_MT through the turned-on PMOS transistors (131<2> and 133<2> in FIG. 6). Accordingly, the voltage level of the monitoring signal V_MT having a voltage level that is increased due to the leakage current according to the GIDL may be compensated by the pull-down driven second internal voltage VINT<2>.

The $L^{th}$ internal voltage drive circuit 141_L may pull-down drive the $L^{th}$ internal voltage VINT<L> based on the compensation control signal G_ONB, the monitoring signal V_MT, and the $L^{th}$ reference voltage VREF<L>. More specifically, the $L^{th}$ internal voltage drive circuit 141_L may pull-down drive the $L^{th}$ internal voltage VINT<L> based on a comparison result of the monitoring signal V_MT and the $L^{th}$ reference voltage VREF<L> when the compensation control signal G_ONB is activated. As an example, the $L^{th}$ internal voltage drive circuit 141_L may pull-down drive the $L^{th}$ internal voltage VINT<L> to lower the voltage level of the $L^{th}$ internal voltage VINT<L> when the monitoring signal V_MT has a voltage level higher than the $L^{th}$ reference voltage VREF<L> in a state where the compensation control signal G_ONB is activated for the operations in the test mode. As another example, the $L^{th}$ internal voltage drive circuit 141_L may stop the operation of pull-down driving the $L^{th}$ internal voltage VINT<L> when the monitoring signal V_MT has a voltage level equal to or lower than the $L^{th}$ reference voltage VREF<L> in a state where the compensation control signal G_ONB is activated. The $L^{th}$ internal voltage VINT<L> having a voltage level that is lowered due to pull-down driving may be transferred as the monitoring signal V_MT through the turned-on PMOS transistors (131<L> and 133<L> in FIG. 6). Accordingly, the voltage level of the monitoring signal V_MT having a voltage level that is increased due to the leakage current according to the GIDL may be compensated by the pull-down driven $L^{th}$ internal voltage VINT<L>.

Figure 8:
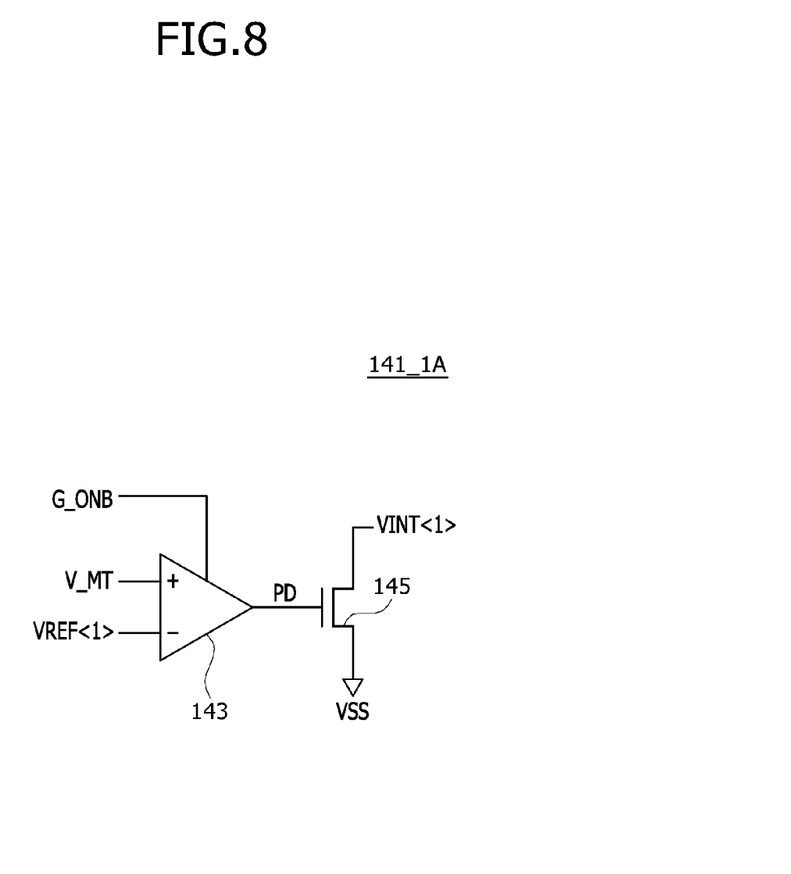
FIG. 8 is a circuit diagram according to an embodiment of a first internal voltage drive circuit included in the internal voltage drive circuit of FIG. 7.

FIG. 8 is a circuit diagram of a first internal voltage drive circuit 141_1A according to an embodiment of the first internal voltage drive circuit 141_1 included in the internal voltage drive circuit of FIG. 7. As shown in FIG. 8, the first internal voltage drive circuit 141_1A may include a pull-down signal generation circuit 143 and a pull-down drive device 145.

The pull-down signal generation circuit 143 may generate a pull-down signal PD based on the compensation control signal G_ONB, the monitoring signal V_MT, and the first reference voltage VREF<1>. More specifically, the pull-down signal generation circuit 143 may generate the pull-down signal PD based on a comparison result of the monitoring signal V_MT and the first reference voltage VREF<1> when the compensation control signal G_ONB is activated. As an example, the pull-down signal generation circuit 143 may generate the pull-down signal PD that is activated at a logic "high" level when the monitoring signal V_MT has a voltage level higher than the first reference voltage VREF<1> in a state in which the compensation control signal G_ONB for the operations in the test mode is activated. As another example, the pull-down signal generation circuit 143 may generate the pull-down signal PD that is deactivated at a logic "low" level when the monitoring signal V_MT has a voltage level equal to or lower than the first reference voltage VREF<1> in a state in which the compensation control signal G_ONB is activated.

The pull-down drive device 145 may pull-down drive the first internal voltage VINT<1> based on the pull-down voltage PD to lower the voltage level of the first internal voltage VINT<1>. As an example, when the monitoring signal V_MT is set to have a voltage level higher than the first reference voltage VREF<1> and the pull-down signal PD activated at a logic "high" level is generated, the pull-down drive device 145 may pull-down drive the first internal voltage VINT<1> to the ground voltage VSS. The voltage level of the monitoring signal V_MT having a voltage level that is increased due to the leakage current according to the GIDL may be compensated by the pull-down driven first internal voltage VINT<1>.

Figure 9:
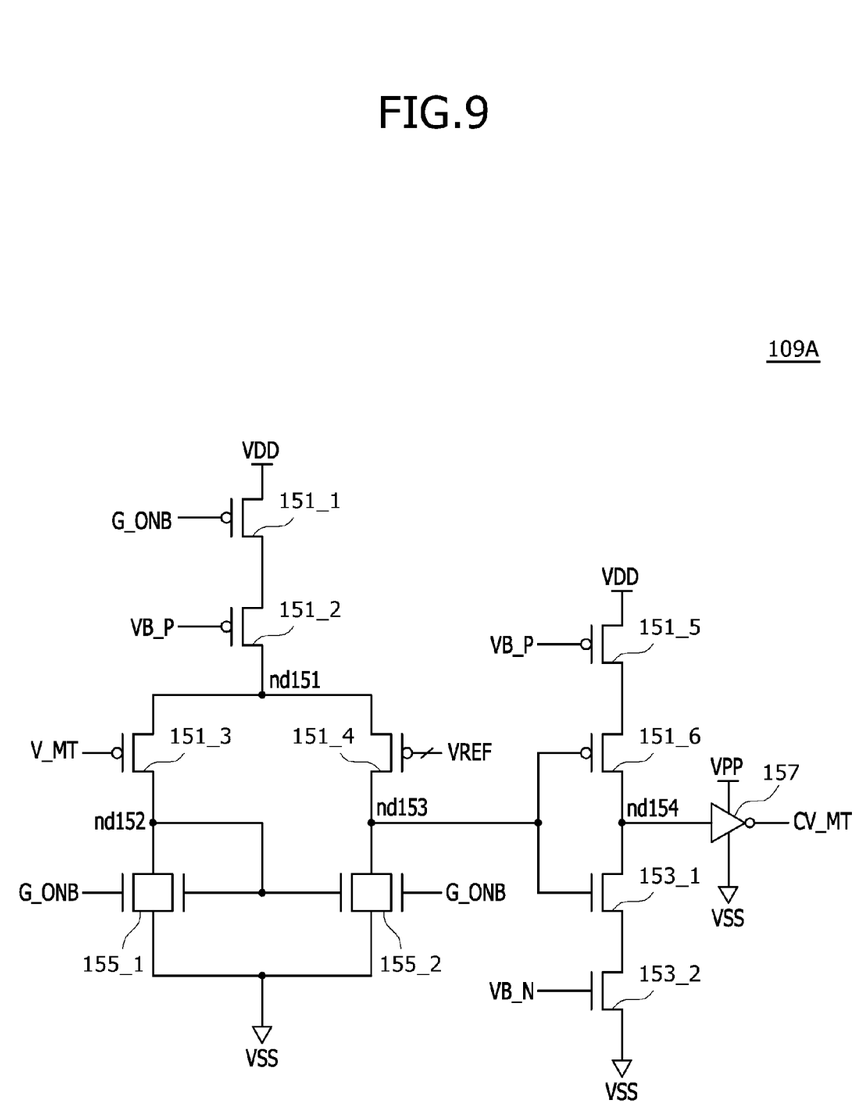
FIG. 9 is a circuit diagram according to an embodiment of a compensation monitoring signal generation circuit included in the electronic device of FIG. 1.

FIG. 9 is a circuit diagram of a compensation monitoring signal generation circuit 109A according to an embodiment of the compensation monitoring signal generation circuit 109 included in the electronic system of FIG. 1. As shown in FIG. 9, the compensation monitoring signal generation circuit 109A may include PMOS transistors 151_1~151_6, NMOS transistors 153_1 and 153_2, transfer gates 155_1 and 155_2, and an inverter 157. The PMOS transistor 151_1 and the PMOS transistor 151_2 may be connected in series between the power supply voltage VDD terminal and a node nd151. The PMOS transistor 151_1 may be turned on in response to the compensation control signal G_ONB. The PMOS transistor 151_2 may be turned on in response to a first bias voltage VB_P. The PMOS transistor 151_3 may be connected between the node nd151 and a node nd152 and may be turned on in response to the monitoring signal V_MT. The PMOS transistor 151_4 may be connected between the node nd151 and a node nd153 and may be turned on in response to the reference voltage VREF. The PMOS transistor 151_5 and the PMOS transistor 151_6 may be connected in series between the power supply voltage VDD terminal and a node nd154. The PMOS transistor 151_5 may be turned on in response to the first bias voltage VB_P. The first bias voltage VB_P may be generated at a preset voltage level so that the PMOS transistors 151_2 and 151_5 are turned on when the internal voltage VINT is generated during the operations in the test mode. The PMOS transistor 151_6 may be turned on in response to a voltage of the node nd153. The NMOS transistor 153_1 and the NMOS transistor 153_2 may be connected in series between the node nd154 and the ground voltage VSS terminal. The NMOS transistor 153_1 may be turned on in response to a voltage of the node nd153. The NMOS transistor 153_2 may be turned on in response to a second bias voltage VB_N. The second bias voltage VB_N may be generated at a preset voltage level so that the NMOS transistor 153_2 is turned on when the internal voltage VINT is generated during the operations in the test mode. The transfer gate 155_1 may be connected between the node nd152 and the ground voltage VSS terminal, and may operate in response to the compensation control signal G_ONB and a signal of the node nd152. The transfer gate 155_2 may be connected between the node nd153 and the ground voltage VSS terminal, and may operate in response to the compensation control signal G_ONB and the signal of the node nd152. The inverter 157 may receive the high voltage VPP and the ground voltage VSS, and may inversely buffer a signal of the node nd154 to generate the compensation monitoring signal CV_MT. The compensation monitoring signal generation circuit 109A may generate the compensation monitoring signal CV_MT having a logic level that is set depending on a comparison result of the monitoring signal V_MT and the reference voltage VREF when the compensation control signal G_ONB is activated for the operations in the test mode. The compensation monitoring signal generation circuit 109A may generate the compensation monitoring signal CV_MT that is set to have a logic "high" level when the monitoring signal V_MT has a voltage level higher than the reference voltage VREF in a state in which the compensation control signal G_ONB is activated at a logic "low" level. It may be confirmed that the voltage level of the monitoring signal V_MT has not been compensated by the compensation monitoring signal CV_MT set to have a logic "high" level. The compensation monitoring signal generation circuit 109A may generate the compensation monitoring signal CV_MT that is set to have a logic "low" level when the monitoring signal V_MT has a voltage level equal to or lower than the reference voltage VREF in a state in which the compensation control signal G_ONB is activated at a logic "low" level. It may be confirmed that the voltage level of the monitoring signal V_MT has been compensated by the compensation monitoring signal CV_MT set to have a logic "low" level.

Figure 10:
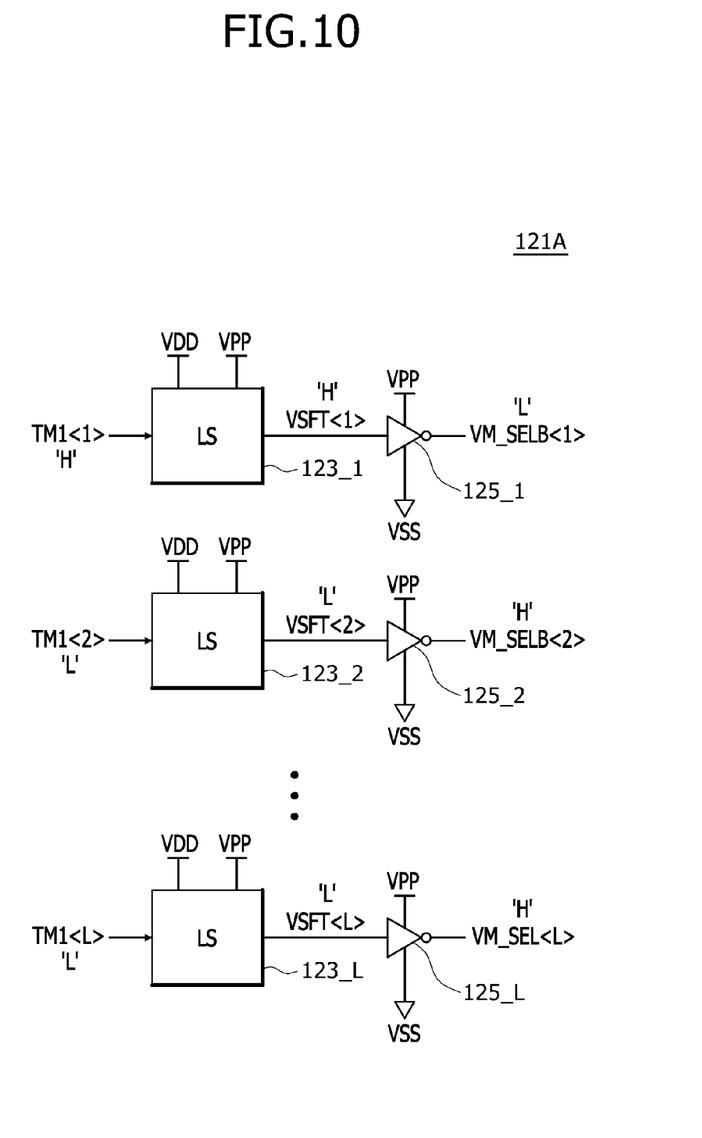
FIGS. 10, 11, and 12 are diagrams illustrating an operation in a test mode for compensating a monitoring signal in an electronic device according to an embodiment of the present disclosure.
Figure 11:
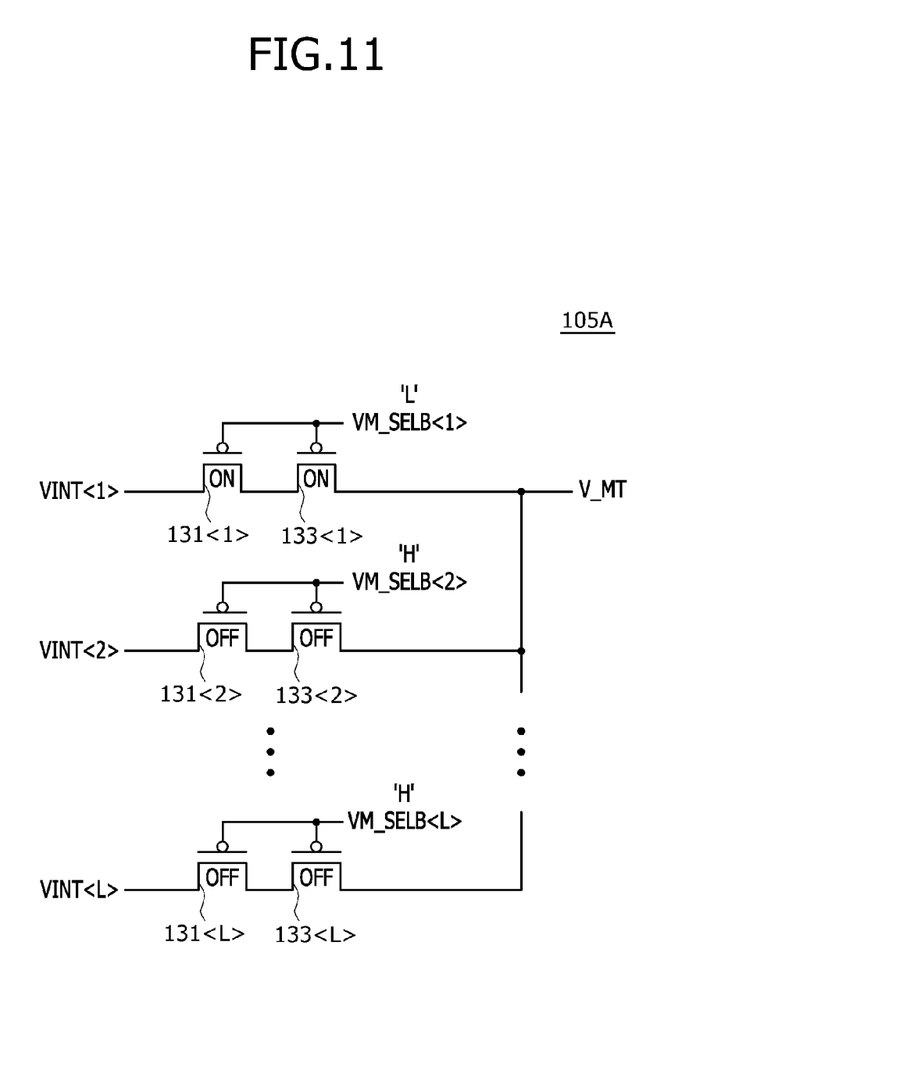
Figure 12:
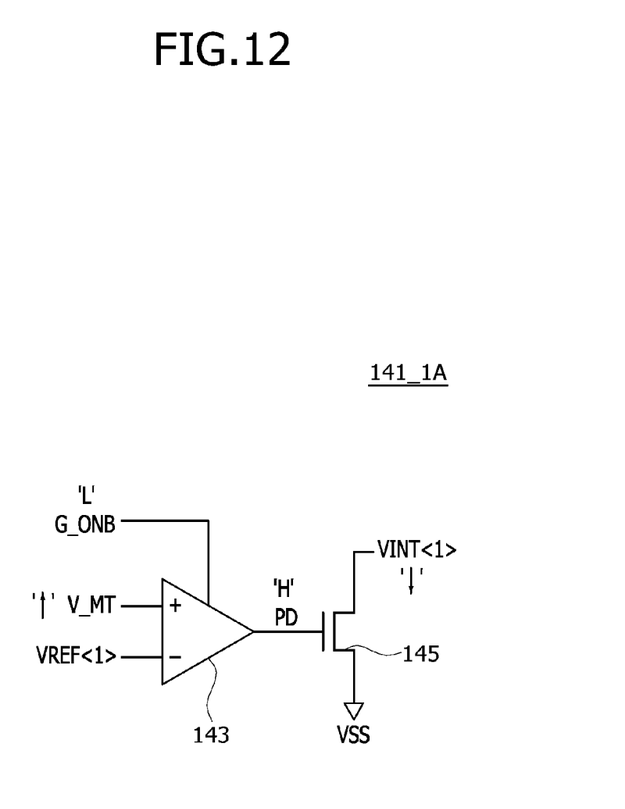

FIGS. 10 to 12 are diagrams illustrating the operations in the test mode for compensating for the monitoring signal V_MT in the electronic device 10 of FIG. 1. An operation in which the monitoring signal V_MT generated from the first internal voltage VINT<1> and distorted by the leakage current according to the GIDL is compensated in the test mode will be described in more detail with reference to FIGS. 10 to 12.

As shown in FIG. 10, the voltage selection signal generation circuit 121A may generate the first voltage selection signal VM_SELB<1> that is activated at a logic "low" level when the first test mode signal TM1 set to have a first logic bit set is input in the test mode. More specifically, the voltage selection signal generation circuit 121A may generate the first voltage selection signal VM_SELB<1> that is activated at a logic "low" level and second to $L^{th}$ voltage selection signals VM_SELB<2:L> that are all deactivated at a logic "high" level when the first bit TM1<1> of the first test mode signal TM1 set to have a logic "high" level 'H' and the second to $L^{th}$ bits TM1<2:L> of the first test mode signal TM1, which are all set to have a logic "low" level 'L', are input.

As shown in FIG. 11, the monitoring signal generation circuit 105A may output the first internal voltage VINT<1> as the monitoring signal V_MT by the PMOS transistors 131<1> and 133<1> turned on 'ON' by the first voltage selection signal VM_SELB<1> that is activated at a logic "low" level. All of the remaining PMOS transistors 131<2:L> and 133<2:L> included in the monitoring signal generating circuit 105A may be turned off 'OFF'.

As shown in FIG. 12, when the voltage level of the monitoring signal V_MT generated from the first internal voltage VINT<1> is increased due to the leakage current according to the GIDL in a state in which the compensation control signal G_ONB is activated at a logic "low" level 'L', the pull-down signal generation circuit 143 included in the first internal voltage drive circuit 141_1A may generate the pull-down signal PD set to have a logic "high" level 'H', and the pull-down drive device 145 may pull-down drive the first internal voltage VINT<1> to the ground voltage VSS. The voltage level of the monitoring signal V_MT having a voltage level that is increased due to the leakage current according to the GIDL may be compensated by the pull-down driven first internal voltage VINT<1>.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered from not a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. An electronic device comprising:
    a monitoring signal generation circuit configured to receive an internal voltage to generate a monitoring signal, based on a voltage selection signal in a test mode; and
    an internal voltage drive circuit configured to receive the internal voltage and monitoring signal from the monitoring signal generation circuit and drive the internal voltage to compensate for the monitoring signal when the monitoring signal is distorted according to a leakage current in the test mode.

2. The electronic device of claim 1, wherein the monitoring signal generation circuit outputs the internal voltage selected by the voltage selection signal as the monitoring signal.

3. The electronic device of claim 2,
    wherein the voltage selection signal includes a first voltage selection signal and a second voltage selection signal,
    wherein the internal voltage includes a first internal voltage and a second internal voltage, and
    wherein the monitoring signal generation circuit outputs the first internal voltage as the monitoring signal, based on the first voltage selection signal, and outputs the second internal voltage as the monitoring signal, based on the second voltage selection signal.

4. The electronic device of claim 1, further comprising a monitoring control signal generation circuit configured to generate the voltage selection signal, based on a test mode signal.

5. The electronic device of claim 1, wherein the internal voltage drive circuit drives the internal voltage, based on the monitoring signal and a reference voltage.

6. The electronic device of claim 5, wherein the internal voltage drive circuit drives the internal voltage when the monitoring signal has a voltage level higher than the reference voltage.

7. The electronic device of claim 6,
wherein the internal voltage drive circuit pull-down drives the internal voltage to lower a voltage level of the internal voltage, and
wherein the monitoring signal generation circuit outputs the pull-down driven internal voltage as the monitoring signal.

8. The electronic device of claim 6, wherein the internal voltage drive circuit includes:
a pull-down signal generation circuit configured to compare the monitoring signal and the reference voltage to generate a pull-down signal; and
a pull-down drive device configured to drive the internal voltage, based on the pull-down signal.

9. The electronic device of claim 1, further comprising a compensation monitoring signal generation circuit configured to generate a compensation monitoring signal including information on whether the monitoring signal, distorted according to the leakage current in the test mode, has been compensated for by the internal voltage drive circuit.

10. The electronic device of claim 9, wherein the compensation monitoring signal generation circuit generates the compensation monitoring signal, based on the monitoring signal, a compensation control signal, and the reference voltage.

11. The electronic device of claim 10, wherein the compensation monitoring signal generation circuit receives the compensation control signal that is activated by a test mode signal in the test mode.

12. The electronic device of claim 10, wherein the compensation monitoring signal generation circuit generates the compensation monitoring signal having a logic level that is determined according to a comparison result of the monitoring signal and the reference voltage.

13. The electronic device of claim 10, wherein the compensation monitoring signal generation circuit generates the compensation monitoring signal having a logic level indicating that the monitoring signal has been compensated for by the internal voltage drive circuit when the monitoring signal has a voltage level equal to or less than the reference voltage.

14. An electronic device comprising:
an internal voltage drive circuit configured receive an internal voltage to drive the internal voltage to compensate for a monitoring signal when the monitoring signal is distorted according to a leakage current in a test mode in which the monitoring signal is generated from the internal voltage; and
a compensation monitoring signal generation circuit configured to generate a compensation monitoring signal including information on whether the monitoring signal, distorted according to the leakage current in the test mode, has been compensated for by the internal voltage drive circuit.

15. The electronic device of claim 14, wherein the internal voltage drive circuit drives the internal voltage, based on the monitoring signal and a reference voltage.

16. The electronic device of claim 15, wherein the internal voltage drive circuit drives the internal voltage when the monitoring signal has a voltage level higher than the reference voltage.

17. The electronic device of claim 16,
wherein the internal voltage drive circuit pull-down drives the internal voltage to lower a voltage level of the internal voltage,
further comprising a monitoring signal generation circuit configured to output the pull-down driven internal voltage as the monitoring signal.

18. The electronic device of claim 16, wherein the internal voltage drive circuit includes:
a pull-down signal generation circuit configured to compare the monitoring signal and the reference voltage to generate a pull-down signal; and
a pull-down drive device configured to drive the internal voltage, based on the pull-down signal.

19. The electronic device of claim 14, wherein the compensation monitoring signal generation circuit generates the compensation monitoring signal, based on the monitoring signal, a compensation control signal, and the reference voltage.

20. The electronic device of claim 19, wherein the compensation monitoring signal generation circuit generates the compensation monitoring signal having a logic level that is determined according to a comparison result of the monitoring signal and the reference voltage.

\* \* \* \* \*